United States Patent [19]
Tomita et al.

[11] Patent Number: 4,882,079
[45] Date of Patent: Nov. 21, 1989

[54] PIEZOELECTRIC CERAMIC MATERIALS

[75] Inventors: Masahiro Tomita, Anjo; Eturo Yasuda, Okazaki, Japan

[73] Assignee: Nippon Soken, Inc., Nishio, Japan

[21] Appl. No.: 139,086

[22] Filed: Dec. 23, 1987

Related U.S. Application Data

[63] Continuation of Ser. No. 834,513, Feb. 28, 1986, abandoned, which is a continuation of Ser. No. 678,162, Dec. 4, 1984, abandoned.

[30] Foreign Application Priority Data

Dec. 6, 1983 [JP] Japan ................... 58-231165

[51] Int. Cl.$^4$ ............................................. C04B 35/49
[52] U.S. Cl. ................... 252/62.9; 501/135; 501/136
[58] Field of Search ............... 252/62.9; 501/135, 136

[56] References Cited

U.S. PATENT DOCUMENTS

| | | | |
|---|---|---|---|
| 2,911,370 | 11/1959 | Kulcsar | 252/62.9 |
| 3,372,121 | 3/1968 | Banno | 252/62.9 |
| 3,468,799 | 9/1969 | Kurihara et al. | 252/62.9 |
| 3,630,909 | 12/1971 | Banno et al. | 252/62.9 |

FOREIGN PATENT DOCUMENTS 57-208183 12/1982 Japan .

Primary Examiner—Jack Cooper
Attorney, Agent, or Firm—Cushman, Darby & Cushman

[57] ABSTRACT

Piezoelectric ceramic materials comprising a ternary fundamental solid solution of 0.5 to 5.0 mol % of $Pb(Y_{\frac{1}{2}}Nb_{\frac{1}{2}})O_3$, 40.0 to 50.0 mol % of $PbTiO_3$, and 45.0 to 59.5 mol % of $PbZrO_3$ are described. In the ceramic materials, part of Pb in the solid solution is substituted with 5.0 to 15.0 mol % of Sr, and at least one member selected from the group consisting of $Nb_2O_5$, $WO_3$, $La_2O_3$, $TaO_3$, $Bi_2O_3$, $Tb_4O_7$, NdO and $Pr_6O_{11}$ is further contained in the solid solution in an amount of 0.1 to 2.0 wt % of the solid solution.

3 Claims, No Drawings

PIEZOELECTRIC CERAMIC MATERIALS

This is a continuation of application Ser. No. 834,513, field Feb. 28, 1986, which was abandoned upon the filing hereof; and which was a continuation of Ser. No. 678,162, filed Dec. 4, 1984, now abandoned.

BACKGROUND OF THE INVENTION

1. Field of the Invention

This invention relates to piezoelectric ceramic materials which are effectively utilizable in various types of actuators and which are composed of ternary solid solutions having a fundamental composition of $Pb(Y_{\frac{1}{2}}Nb_{\frac{1}{2}})O_3$-$PbTiO_3$-$PbZrO_3$.

2. Description of the Prior Art

Piezoelectric ceramic materials used in actuators should have various characteristics such as a high piezoelectric constant, a high Curie point and high mechanical strength. One piezoelectric material which has been most widely used at present is a piezoelectric ceramic material composed of a ternary solid solution of $Pb(Y_{\frac{1}{2}}Nb_{\frac{1}{2}})O_3$-$PbTiO_3$-$PbZrO_3$. Many studies have been made on the above ceramic material in order to further improve the characteristics mentioned above. For instance, in order to improve the mechanical strength, there were proposed ceramic materials in Japanese Unexamined Patent Publication No. 57-208183 in which part of Pb in the solid solution was substituted with Ba, Sr, Ca or the like and 0.1 to 1.0 wt% of $In_2O_3$, MgO, $Sb_2O_3$ or the like was added thereto.

The improvement in the strength of piezoelectric ceramic materials is needed especially when thin plates of piezoelectric ceramic materials are used in ultrasonic transducer elements or circuit elements. However, when thin plates of piezoelectric materials are laminated for use as actuators, it is desirable to increase the degree of the displacement of piezoelectric ceramic materials upon application of an electric field as large as possible rather than to improve the mechanical strength thereof by improving the piezoelectric constant of the materials.

SUMMARY OF THE INVENTION

It is accordingly an object of the present invention to provide piezoelectric materials which are suitably applied as actuators.

It is another object of the invention to provide piezoelectric ceramic materials which comprise ternary solid solutions mainly composed of $Pb(Y_{\frac{1}{2}}Nb_{\frac{1}{2}})O_3$-$PbTiO_3$-$PbZrO_3$ and whose piezoelectric constant is improved.

The above objects can be achieved, according to the present invention, by a piezoelectric ceramic material which comprises a ternary solid solution of 0.5 to 5.0 mol% of $Pb(Y_{\frac{1}{2}}Nb_{\frac{1}{2}})O_3$, 40.0 to 50.0 mol% of $PbTiO_3$, and 45.0 to 59.5 mol% of $PbZrO_3$, part of Pb in the solid solution being substituted with 5.0 to 15.0 mol% of Sr, at least one member selected from the group consisting of $Nb_2O_5$, $WO_3$, $La_2O_3$, $TaO_3$, $Bi_2O_3$, $Tb_4O_7$, NdO and $Pr_6O_{11}$ being further contained in the solid solution in an amount of 0.1 to 2.0 wt% of the solid solution.

The piezoelectric materials according to the present invention have a piezoelectric constant as high as about $400 \times 10^{-12}$ to $600 \times 10^{-12}$ m/V. Upon application of an electric field, a great degree of displacement can be obtained, so that the piezoelectric ceramic materials of the invention can be effectively utilized as piezoelectric materials for various actuators such as of injectors for internal combustion engines of vehicles.

DETAILED DESCRIPTION AND EMBODIMENTS OF THE INVENTION

The piezoelectric ceramic materials of the present invention are prepared, for example, by powdered metal techniques. More particularly, starting materials for these ceramic materials such as PbO, $TiO_2$, $ZrO_2$, $Y_2O_3$, $Nb_2O_5$, $WO_3$, $La_2O_3$, $TaO_3$, $Bi_2O_3$, $SrCO_3$, $Tb_4O_7$, $Pr_6O_{11}$, NdO and the like are weighed in predetermined ratios and mixed such as in a wet ball mill. The resulting mixture is dried, calcined at temperatures of 700° to 900° C. for 3 to 10 hours and again mixed in a ball mill. After drying, there is obtained the intended powder. The powder may be used in various ways to make sheets, plates, cylinders, columns or the like forms as desired.

In the practice of the invention, the piezoelectric constant of various ceramic materials is measured as follows.

To the powder obtained above is added a binder such as water or polyvinyl alcohol, followed by press molding under pressure of 300 to 1000 kg/cm² and sintering at a temperature of 1200° to 1300° C. for 1 to 3 hours to obtain moldings of a columnar form having a diameter of 5 mm and a length of 8 mm.

The columns are polished on the surfaces thereof, after which electrodes are formed at opposite sides thereof by a known method. The electrode-formed column is placed in an insulating oil and a D.C. electric field of 20 to 30 KV/cm is applied across the electrodes for 6 to 60 minutes for polarization. Thereafter, the polarized column is aged at 120° C. for 1 hour and cooled down to normal temperatures to obtain a sample for measurement.

The piezoelectric constant $d_{33}$ of the sample is determined according to the following equation (1), in which $k_{33}$, $\epsilon_{33}$ and $S_{33}$ are obtained according to the equations (2) (3) and (4), respectively.

$$d_{33} = k_{33}\sqrt{\epsilon_{33} \cdot S_{33}} \quad (1)$$

$$1/(k_{33})^2 = 0.405 \times fr/(fa-fr) + 0.81 \quad (2)$$

$$\epsilon_{33} = C \times l/S \quad (3)$$

$$1/S_{33} = 4\rho \cdot fa^2 \cdot l^2 (1-k_{33}^2) \quad (4)$$

in which l is a length (m) of the sample, S is an area (m²) of the sample, C is an electrostatic capacitance (F) when measured at 1 KHz by the use of a LCR meter, $\rho$ is a density (kg/m³), and fa and fr are, respectively, antiresonance and resonance frequencies (Hz). These are measured by inown methods. It will be noted that $k_{33}$ is an electromechanical coupling coefficient.

Tables 1 to 7 show the contents and characteristics of samples made in the procedure as described above. The samples include Examples 1–52 of the present invention and References 1–18.

Starting materials indicated in Tables 1 through 7 were used in different amounts to make samples in the same procedure as described before. The examples of the present invention and reference samples were subjected to measurements of density after sintering, specific inductive capacity, Curie point and piezoelectric constant.

In Examples 1 through 10, the amount of Sr substituted for Pb is changed in the range of from 5 to 15 mol% and the content of $Nb_2O_5$ is changed in the range of from 0.1 to 2.0 wt%. All the samples have such large piezoelectric constant values over $447 \times 10^{-12}$ m/V. From the results of Examples 1 through 4, it will be found that when the amount of the substituted Sr increases, the piezoelectric constant increases with a tendency that the Curie point lowers. High piezoelectric constants are obtained while maintaining high Curie points when the amount of substituted Sr is in the range of from 10 to 12.5 mol% and the content of $Nb_2O_5$ is in the range of 0.1 to 1.0 wt%. Thus, such ranges as mentioned above are preferred.

In Reference 1, the amount of substituted Sr is as small as 3 mol%, so that the piezoelectric constant does not reach $400 \times 10^{-12}$ m/V. Reference 2 deals with the case where the amount of substituted Sr exceeds 15 mol%, so that although the piezoelectric constant is high the Curie point is too low to be practically used. The sample of Reference 3 contains no additive oxide. This sample has a piezoelectric constant of $400 \times 10^{-12}$ m/V but is unfavorably low in strength (not shown). When the content of the additive oxide exceeds 2.0 wt% as in Reference 4, the piezoelectric constant sharply decreases.

From the results of Examples 3, 11, 12 and references 5, 6, when $Pb(Y_{\frac{1}{2}}Nb_{\frac{1}{2}})O_3$ is about 2 mol%, the piezoelectric constant becomes maximum. Larger or smaller amounts result in the tendency toward reduction of the piezoelectric constant. Moreover, when the amount of $Pb(Y_{\frac{1}{2}}Nb_{\frac{1}{2}})O_3$ is less than 0.5 mol% or exceeds 5 mol%, the piezoelectric constant does not reach $400 \times 10^{-12}$ m/V.

Examples 13 through 17 and References 7 through 9 are cases where the contents of $PbTiO_3$ and $PbZrO_3$ are changed. It will be found that when comparing these samples with the sample of Example 3, there is the tendency that the piezoelectric constant decreases as the composition deviates from the composition of the sample of Example 3. Especially with the compositions (Reference 7 through 9) in which the content of $PbTiO_3$ is outside the range of from 40 to 50 mol% and the content of $PbZrO_3$ is outside the range of from 45 to 59.5 mol%, the piezoelectric constant is very small.

In the samples described above, the additive oxide is $Nb_2O_5$ alone. In Examples 18 through 28, only the kind of additive oxide is different from the case of Example 3. More particularly, in these examples, one additive selected from the group consisting of $WO_3$, $La_2O_3$, $Bi_2O_3$, $TaO_3$ and mixtures thereof is used. In several examples, $Nb_2O_5$ is added to the above additive. The piezoelectric constants of these samples are near the piezoelectric constant of Example 3.

The samples of Examples 29 through 45 and References 10 thrugh 18 all contain $Tb_4O_7$ as the additives. In Examples 29 through 34 and References 10, 11, the same composition is used but different in the amount of $Tb_4O_7$. When the amount of $Tb_4O_7$ is in the range of 0.1 to 2.0 mol%, large piezoelectric constants are obtained. Higher or lower amounts of $Tb_4O_7$ than the above range result in the lowering of the piezoelectric constant.

In Examples 36, 37, 38 and References 12, 13, the amount of Sr substituted for Pb is different. Smaller amounts result in smaller piezoelectric constants though the Curie point increases. On the contrary, when the amount of the substitution increases, the Curie point decreases and the piezoelectric constant lowers. The amount of the substitution is conveniently in the range of from 5 to 15 mol%.

In Examples 35, 39, 40 and References 14, 15, the amount of $Pb(Y_{\frac{1}{2}}Nb_{\frac{1}{2}})O_3$ is changed. High piezoelectric constants are obtained when the amount is in the range of from 0.5 to 5 mol%.

In Examples 41 through 45 and references 16 through 18, a ratio of $PbTiO_3$ and $PbZrO_3$ is changed. When the content of $PbTiO_3$ is in the range of 40 to 50 mol% and the content of $PbZrO_3$ is in the range of from 45 to 58.0, high piezoelectric constants are obtained.

In Examples 46, 47, $Pr_6O_{11}$ is used as the additive and in Examples 48, 49, NdO is used as the additive. The additives of Examples 50 through 52 are two or more mixtures of $Tb_4O_7$, $Pr_6O_{11}$ and NdO. In all the cases, there are shown tendencies similar to the foregoing examples.

Gathering the foregoing, the piezoelectric ceramic materials according to the invention should comprise a ternary fundamental solid solution of 0.5 to 5.0 mol% of $Pb(T_{\frac{1}{2}}Nb_{\frac{1}{2}})O_3$ 40.0 to 50.0 mol% of $PbTiO_3$, and 45.0 to 59.5 mol% of $PbZrO_3$, part of Pb in the solid solution being substituted with 10.0 to 15.0 mol% of Sr, at least one member selected from the group consisting of $Nb_2O_5$, $WO_3$, $La_2O_3$, $TaO_3$, $Bi_2O_3$, $Tb_4O_7$, NdO and $Pr_6O_{11}$ being further contained in the solid solution in an amount of 0.1 to 2.0 wt% of the solid solution. These ceramic materials have good mechanical strength, a high Curie point and a very good piezoelectric constant.

When $Pb(Y_{\frac{1}{2}}Nb_{\frac{1}{2}})O_3$ which is one of fundamental ingredients of the ternary solid solution is less than 0.5 mol%, the piezoelectric constant is insufficiently low, when the amount exceeds 5.0 mol%, it is difficult to obtain a uniform solid solution with the lowering of the piezoelectric constant.

If the amount of $PbTiO_3$ is outside the range of 40.0 to 50.0 mol%, high piezoelectric constants cannot be obtained. The fundamental solid solution comprises 0.5 to 5.0 mol% of $Pb(Y_{\frac{1}{2}}Nb_{\frac{1}{2}})O_3$, 40.0 to 50.0 mol% of $PbTiO_3$ and the balance (45.0 to 59.5 mol%) of $PbZrO_3$.

If the amount of Sr substituted for part of Pb in the fundamental solid solution is less than 5.0 mol%, the specific inductive capacity is small and a high piezoelectric constant cannot be obtained. On the other hand, when the amount exceeds 15 mol%, the Curie temperature considerably lowers. Such materials cannot be practically used.

The amount of the additive oxide less than 0.1 wt% is unfavorable because of the low sinterability and low mechanical strength. Over 2.0 wt%, the Curie temperature is unfavorably low.

The piezoelectric materials of the present invention having such excellent characteristics as described before may be conveniently used as actuators.

TABLE 1

| | x Pb(Y₁Nb₁)O₃ — y PbTiO₃ — z PbZrO₃ + C | | | | | Density of | | Piezo- | |
|---|---|---|---|---|---|---|---|---|---|
| Sample No. | Substitution of Sr for Pb (mol %) | x (mol %) | y (mol %) | z (mol %) | C(wt %) | Sintered Product (g/cm³) | Specific Inductive Capacity | electric Constant (× 10⁻¹² m/V) | Curie Point (°C.) |
| Example 1 | 5 | 2 | 43 | 55 | Nb₂O₅ 0.5 | 7.52 | 2210 | 447 | 285 |
| 2 | 10 | 2 | 43 | 55 | Nb₂O₅ 0.5 | 7.50 | 2430 | 503 | 230 |
| 3 | 12.5 | 2 | 43 | 55 | Nb₂O₅ 0.5 | 7.48 | 2940 | 587 | 205 |
| 4 | 15 | 2 | 43 | 55 | Nb₂O₅ 0.5 | 7.49 | 3210 | 586 | 180 |
| 5 | 12.5 | 2 | 43 | 55 | Nb₂O₅ 0.3 | 7.45 | 2550 | 556 | 210 |
| 6 | 12.5 | 2 | 43 | 55 | Nb₂O₅ 0.7 | 7.47 | 2740 | 572 | 205 |
| 7 | 12.5 | 2 | 43 | 55 | Nb₂O₅ 1.0 | 7.50 | 2540 | 542 | 205 |
| 8 | 12.5 | 2 | 43 | 55 | Nb₂O₅ 2.0 | 7.48 | 2310 | 452 | 200 |
| 9 | 12.5 | 2 | 43 | 55 | Nb₂O₅ 0.1 | 7.46 | 2480 | 529 | 210 |
| 10 | 12.5 | 2 | 43 | 55 | Nb₂O₅ 1.5 | 7.49 | 2460 | 517 | 200 |
| Reference 1 | 3 | 2 | 43 | 55 | Nb₂O₅ 0.5 | 7.52 | 1810 | 375 | 300 |
| 2 | 17.5 | 2 | 43 | 55 | Nb₂O₅ 0.5 | 7.47 | 3420 | 535 | 145 |
| 3 | 12.5 | 2 | 43 | 55 | Nb₂O₅ 0 | 7.40 | 2240 | 440 | 210 |

TABLE 2

| | x Pb(Y₁Nb₁)O₃ — y PbTiO₃ — z PbZrO₃ + C | | | | | Density of | | Piezo- | |
|---|---|---|---|---|---|---|---|---|---|
| Sample No. | Substitution of Sr for Pb (mol %) | x (mol %) | y (mol %) | z (mol %) | C(wt %) | Sintered Product (g/cm³) | Specific Inductive Capacity | electric Constant (× 10⁻¹² m/V) | Curie Point (°C.) |
| Reference 4 | 12.5 | 2 | 43 | 55 | Nb₂O₅ 3.0 | 7.42 | 1860 | 367 | 195 |
| Example 11 | 12.5 | 5 | 42 | 53 | Nb₂O₅ 0.5 | 7.47 | 2310 | 472 | 205 |
| 12 | 12.5 | 0.5 | 43.5 | 56 | Nb₂O₅ 0.5 | 7.46 | 1940 | 422 | 210 |
| Reference 5 | 12.5 | 0 | 44 | 56 | Nb₂O₅ 0.5 | 7.38 | 1710 | 326 | 210 |
| 6 | 12.5 | 8 | 40 | 52 | Nb₂O₅ 0.5 | 7.06 | f260 | 221 | 215 |
| Example 13 | 12.5 | 2 | 40 | 58 | Nb₂O₅ 0.5 | 7.46 | 2390 | 479 | 300 |
| 14 | 12.5 | 2 | 46 | 52 | Nb₂O₅ 0.5 | 7.45 | 2360 | 465 | 215 |
| 15 | 12.5 | 2 | 50 | 48 | Nb₂O₅ 0.5 | 7.45 | 2200 | 420 | 225 |
| 16 | 12.5 | 2 | 49 | 49 | Nb₂O₅ 0.5 | 7.52 | 2210 | 407 | 230 |
| 17 | 12.5 | 2 | 48 | 50 | Nb₂O₅ 0.5 | 7.51 | 2230 | 421 | 220 |
| Reference 7 | 12.5 | 2 | 38 | 60 | Nb₂O₅ 0.5 | 7.47 | 1180 | 203 | 195 |
| 8 | 12.5 | 2 | 52 | 46 | Nb₂O₅ 0.5 | 7.51 | 1160 | 197 | 220 |

TABLE 3

| | x Pb(Y₁Nb₁)O₃ — y PbTiO₃ — z PbZrO₃ + C | | | | | Density of | | Piezo- | |
|---|---|---|---|---|---|---|---|---|---|
| Sample No. | Substitution of Sr for Pb (mol %) | x (mol %) | y (mol %) | z (mol %) | C(wt %) | Sintered Product (g/cm³) | Specific Inductive Capacity | electric Constant (× 10⁻¹² m/V) | Curie Point (°C.) |
| Reference 9 | 12.5 | 2 | 55 | 43 | Nb₂O₅ 0.5 | 7.52 | 1090 | 181 | 240 |
| Example 18 | 12.5 | 2 | 43 | 55 | WO₃ 0.5 | 7.46 | 2890 | 562 | 205 |
| 19 | 12.5 | 2 | 43 | 55 | La₂O₃ 0.5 | 7.50 | 2910 | 570 | 205 |
| 20 | 12.5 | 2 | 43 | 55 | TaO₃ 0.5 | 7.48 | 2970 | 589 | 205 |
| 21 | 12.5 | 2 | 43 | 55 | Bi₂O₃ 0.5 | 7.47 | 2920 | 568 | 205 |
| 22 | 12.5 | 2 | 43 | 55 | Nb₂O₅ 0.25 WO₃ 0.25 | 7.47 | 2930 | 579 | 205 |
| 23 | 12.5 | 2 | 43 | 55 | Nb₂O₅ 0.25 TaO₃ 0.25 | 7.48 | 2880 | 577 | 205 |
| 24 | 12.5 | 2 | 43 | 55 | WO₃ 0.2 La₂O₃ 0.2 TaO₃ 0.1 | 7.49 | 2920 | 568 | 205 |

TABLE 4

| | x Pb(Y₁Nb₁)O₃ — y PbTiO₃ — z PbZrO₃ + C | | | | | Density of | | Piezo- | |
|---|---|---|---|---|---|---|---|---|---|
| Sample No. | Substitution of Sr for Pb (mol %) | x (mol %) | y (mol %) | z (mol %) | C(wt %) | Sintered Product (g/cm³) | Specific Inductive Capacity | electric Constant (× 10⁻¹² m/V) | Curie Point (°C.) |
| Example 25 | 12.5 | 2 | 43 | 55 | TaO₃ 0.2 Bi₂O₃ 0.2 Nb₂O₅ 0.1 | 7.48 | 2890 | 570 | 205 |
| 26 | 12.5 | 2 | 43 | 55 | La₂O₃ 0.2 TaO₃ 0.2 Bi₂O₃ 0.1 | 7.48 | 2900 | 569 | 205 |
| 27 | 12.5 | 2 | 43 | 55 | Nb₂O₅ 0.2 La₂O₃ 0.1 TaO₃ 0.1 | 7.51 | 2890 | 572 | 205 |

TABLE 4-continued

| | | $x\ Pb(Y_{\frac{1}{2}}Nb_{\frac{1}{2}})O_3 - y\ PbTiO_3 - z\ PbZrO_3 + C$ | | | | Density of Sintered Product (g/cm³) | Specific Inductive Capacity | Piezo-electric Constant ($\times 10^{-12}$ m/V) | Curie Point (°C) |
|---|---|---|---|---|---|---|---|---|---|
| Sample No. | Substitution of Sr for Pb (mol %) | x (mol %) | y (mol %) | z (mol %) | C(wt %) | | | | |
| 28 | 12.5 | 2 | 43 | 55 | $Bi_2O_3$ 0.1<br>$Nb_2O_5$ 0.1<br>$WO_3$ 0.1<br>$La_2O_3$ 0.1<br>$TaO_3$ 0.1 | 7.48 | 2910 | 570 | 205 |
| 29 | 11.5 | 2 | 44 | 54 | $Bi_2O_3$ 0.1<br>$Tb_4O_7$ 0.1 | 7.44 | 2880 | 545 | 235 |

TABLE 5

| | | $x\ Pb(Y_{\frac{1}{2}}Nb_{\frac{1}{2}})O_3 - y\ PbTiO_3 - z\ PbZrO_3 + C$ | | | | Density of Sintered Product (g/cm³) | Specific Inductive Capacity | Piezo-electric Constant ($\times 10^{-12}$ m/V) | Curie Point (°C) |
|---|---|---|---|---|---|---|---|---|---|
| Sample No. | Substitution of Sr for Pb (mol %) | x (mol %) | y (mol %) | z (mol %) | C(wt %) | | | | |
| Example 30 | 11.5 | 2 | 44 | 54 | $Tb_4O_7$ 1.5 | 7.48 | 2885 | 549 | 235 |
| 31 | 11.5 | 2 | 44 | 54 | $Tb_4O_7$ 0.3 | 7.45 | 2513 | 500 | 235 |
| 32 | 11.5 | 2 | 44 | 54 | $Tb_4O_7$ 0.5 | 7.48 | 2702 | 512 | 230 |
| 33 | 11.5 | 2 | 44 | 54 | $Tb_4O_7$ 1.0 | 7.48 | 3000 | 510 | 220 |
| 34 | 11.5 | 2 | 44 | 54 | $Tb_4O_7$ 2.0 | 7.46 | 3210 | 480 | 210 |
| 35 | 11.5 | 4 | 43 | 53 | $Tb_4O_7$ 0.5 | 7.50 | 2918 | 552 | 230 |
| 36 | 12.5 | 2 | 44 | 54 | $Tb_4O_7$ 0.5 | 7.51 | 3310 | 500 | 215 |
| 37 | 5.0 | 2 | 44 | 54 | $Tb_4O_7$ 0.5 | 7.49 | 2630 | 461 | 280 |
| 38 | 15.0 | 2 | 44 | 54 | $Tb_4O_7$ 0.5 | 7.48 | 3730 | 505 | 200 |
| Reference 10 | 11.5 | 2 | 44 | 54 | $Tb_4O_7$ 0 | 7.40 | 2010 | 420 | 235 |
| 11 | 11.5 | 2 | 44 | 54 | $Tb_4O_7$ 3 | 7.40 | 3360 | 413 | 190 |
| 12 | 17.5 | 2 | 44 | 54 | $Tb_4O_7$ 0.5 | 7.45 | 3510 | 400 | 175 |
| 13 | 3.0 | 2 | 44 | 54 | $Tb_4O_7$ 0.5 | 7.50 | 1920 | 375 | 300 |

TABLE 6

| | | $x\ Pb(Y_{\frac{1}{2}}Nb_{\frac{1}{2}})O_3 - y\ PbTiO_3 - z\ PbZrO_3 + C$ | | | | Density of Sintered Product (g/cm³) | Specific Inductive Capacity | Piezo-electric Constant ($\times 10^{-12}$ m/V) | Curie Point (°C) |
|---|---|---|---|---|---|---|---|---|---|
| Sample No. | Substitution of Sr for Pb (mol %) | x (mol %) | y (mol %) | z (mol %) | C(wt %) | | | | |
| Example 39 | 11.5 | 0.5 | 43.5 | 56 | $Tb_4O_7$ 0.5 | 7.46 | 2320 | 475 | 215 |
| 40 | 11.5 | 5 | 42 | 53 | $Tb_4O_7$ 0.5 | 7.46 | 3005 | 498 | 225 |
| Reference 14 | 11.5 | 0 | 44 | 56 | $Tb_4O_7$ 0.5 | 7.35 | 1750 | 330 | 230 |
| 15 | 11.5 | 8 | 40 | 52 | $Tb_4O_7$ 0.5 | 7.05 | 1300 | 220 | 215 |
| Example 41 | 11.5 | 2 | 40 | 58 | $Tb_4O_7$ 0.5 | 7.45 | 2410 | 469 | 220 |
| 42 | 11.5 | 2 | 46 | 52 | $Tb_4O_7$ 0.5 | 7.44 | 2480 | 455 | 230 |
| 43 | 11.5 | 2 | 50 | 48 | $Tb_4O_7$ 0.5 | 7.45 | 2220 | 440 | 235 |
| 44 | 11.5 | 2 | 53 | 45 | $Tb_4O_7$ 0.5 | 7.50 | 2230 | 445 | 235 |
| 45 | 11.5 | 2 | 48 | 50 | $Tb_4O_7$ 0.5 | 7.50 | 2250 | 431 | 235 |
| Reference 16 | 11.5 | 2 | 38 | 60 | $Tb_4O_7$ 0.5 | 7.45 | 1220 | 230 | 220 |
| 17 | 11.5 | 2 | 52 | 46 | $Tb_4O_7$ 0.5 | 7.49 | 1180 | 190 | 240 |
| 18 | 11.5 | 2 | 55 | 43 | $Tb_4O_7$ 0.5 | 7.49 | 1110 | 185 | 240 |

TABLE 7

| | | $x\ Pb(Y_{\frac{1}{2}}Nb_{\frac{1}{2}})O_3 - y\ PbTiO_3 - z\ PbZrO_3 + C$ | | | | Density of Sintered Product (g/cm³) | Specific Inductive Capacity | Piezo-electric Constant ($\times 10^{-12}$ m/V) | Curie Point (°C) |
|---|---|---|---|---|---|---|---|---|---|
| Sample No. | Substitution of Sr for Pb (mol %) | x (mol %) | y (mol %) | z (mol %) | C(wt %) | | | | |
| Example 46 | 11.5 | 2 | 44 | 54 | $Pr_6O_{11}$ 0.5 | 7.47 | 2664 | 510 | 235 |
| 47 | 11.5 | 4 | 43 | 53 | $Pr_6O_{11}$ 0.5 | 7.49 | 2992 | 509 | 220 |
| 48 | 11.5 | 2 | 44 | 54 | NdO 0.5 | 7.49 | 3000 | 550 | 240 |
| 49 | 11.5 | 4 | 43 | 53 | NdO 0.5 | 7.48 | 3098 | 564 | 220 |
| 50 | 11.5 | 2 | 44 | 54 | $Tb_4O_7$ 0.25<br>$Pr_6O_{11}$ 0.25 | 7.50 | 2880 | 540 | 235 |
| 51 | 11.5 | 2 | 44 | 54 | $Tb_4O_7$ 0.25<br>NdO 0.25 | 7.48 | 2903 | 545 | 235 |
| 52 | 11.5 | 2 | 44 | 54 | $Tb_4O_7$ 0.2<br>$Pr_6O_{11}$ 0.2<br>NdO 0.1 | 7.48 | 2880 | 550 | 235 |

What is claimed is:

1. A piezoelectric ceramic material comprising a ternary fundamental solid solution of 0.5 to 5.0 mol% of $Pb(Y_{\frac{1}{2}}Nb_{\frac{1}{2}})O_3$, 40.0 to 50.0 mol% of $PbTiO_3$, and 45.0 to 59.5 mol% of $PbZrO_3$, in which part of the Pb in the solid solution is substituted with 10.0 to 15.0 mol% of Sr, $Nb_2O_5$ being further contained in the solid solution in an amount of 0.1 to 2.0 wt% of the solid solution.

2. The piezoelectric ceramic material according to claim 1, comprising a ternary fundamental solid solution of 1.0 to 4.0 mol% of $Pb(Y_{\frac{1}{2}}Nb_{\frac{1}{2}})O_3$, 41.0 to 44.0 mol% of $PbTiO_3$, and 51.0 to 58.0 mol% of $PbZrO_3$, in which part of the Pb in the solid solution is substituted with 10.0 to 15.0 mol% of Sr, $Nb_2O_5$ being further contained in an amount of from 0.1 to 1.5 wt% of the solid solution.

3. The piezoelectric ceramic material according to claim 2, wherein the amount of Sr that is substituted for the Pb in the solid solution is in the range of from 10.0 to 12.5 mol% and $Nb_2O_5$ is contained in an amount of from 0.1 to 1.0 wt% of the solid solution.

* * * * *